United States Patent
Ohno

(10) Patent No.: US 11,977,022 B2
(45) Date of Patent: May 7, 2024

(54) OPTICAL INSPECTION METHOD, OPTICAL INSPECTION DEVICE, AND NON-TRANSITORY COMPUTER-READABLE STORAGE MEDIUM STORING OPTICAL INSPECTION PROGRAM

(71) Applicant: KABUSHIKI KAISHA TOSHIBA, Tokyo (JP)

(72) Inventor: Hiroshi Ohno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 17/462,639

(22) Filed: Aug. 31, 2021

(65) Prior Publication Data
US 2022/0299429 A1  Sep. 22, 2022

(30) Foreign Application Priority Data
Mar. 18, 2021 (JP) ................................. 2021-044567

(51) Int. Cl.
*G01N 21/31* (2006.01)
*H01L 27/146* (2006.01)

(52) U.S. Cl.
CPC ....... *G01N 21/31* (2013.01); *H01L 27/14621* (2013.01); *H01L 27/14643* (2013.01); *G01N 2021/3129* (2013.01)

(58) Field of Classification Search
CPC ............ G01N 21/31; G01N 2021/3129; H01L 27/14621; H01L 27/14643; G06T 7/90; G06T 2207/10052
See application file for complete search history.

(56) References Cited

U.S. PATENT DOCUMENTS

| | | | |
|---|---|---|---|
| 7,764,319 B2 * | 7/2010 | Fukumoto | G06T 5/73 348/335 |
| 10,732,102 B2 | 8/2020 | Ohno et al. | |
| 11,315,467 B1 * | 4/2022 | Mandle | G09G 3/346 |
| 2013/0041216 A1 * | 2/2013 | McDowall | G02B 6/001 600/109 |
| 2015/0300807 A1 | 10/2015 | Xalter et al. | |

(Continued)

FOREIGN PATENT DOCUMENTS

| | | | |
|---|---|---|---|
| DE | 102015210440 A1 * | 12/2015 | ............. G01B 11/24 |
| JP | 2008-209726 A | 9/2008 | |

(Continued)

OTHER PUBLICATIONS

A. Gatti et al., "Correlated imaging, quantum and classical," Physical Review A, vol. 70, pp. 013802-1 to 013802-10 (2004).

(Continued)

*Primary Examiner* — Mohamed K Amara
(74) *Attorney, Agent, or Firm* — Finnegan, Henderson, Farabow, Garrett & Dunner, LLP

(57) ABSTRACT

According to one embodiment, an optical inspection method acquires, for an image point imaged through separating light from an object point into beams of light in at least two different and independent wavelength ranges, a hue vector having, as independent axes, intensities of the beams of light in the at least two different and independent wavelength ranges. The method then acquires, from the hue vector, information regarding a ray direction of the light from the object point.

13 Claims, 7 Drawing Sheets

(56) References Cited

U.S. PATENT DOCUMENTS

| | | | |
|---|---|---|---|
| 2016/0156888 A1 | 6/2016 | Euler et al. | |
| 2016/0180552 A1* | 6/2016 | Li | G06T 11/001 345/591 |
| 2019/0172415 A1* | 6/2019 | Davis | G06T 7/90 |
| 2019/0364267 A1 | 11/2019 | Ohno et al. | |
| 2022/0051604 A1* | 2/2022 | Bogdanowicz | G09G 5/02 |
| 2022/0132089 A1* | 4/2022 | Skorka | H04N 23/80 |

FOREIGN PATENT DOCUMENTS

| | | | | |
|---|---|---|---|---|
| JP | 4405525 B2 * | 1/2010 | | G02B 27/2214 |
| JP | 2016-524149 A | 8/2016 | | |
| JP | 2019-124542 A | 7/2019 | | |
| JP | 2019124542 A * | 7/2019 | | G01B 11/14 |
| JP | 2019-203796 A | 11/2019 | | |
| JP | 2019203796 A * | 11/2019 | | G02B 13/22 |
| JP | 2021012356 A * | 2/2021 | | |
| WO | WO-2019156203 A1 * | 8/2019 | | |

OTHER PUBLICATIONS

A. Gatti et al., "Ghost Imaging with Thermal Light: Comparing Entanglement and Classical Correlation," Physical Review Letters, vol. 93, No. 9, pp. 093602-1 to 093602-4 (2004).

Alejandra Valencia et al., "Two-photon imaging with thermal light," Physical Review Letters, vol. 94, 063601, 4 pages (2005).

Jeffrey H. Shapiro, "Computational Ghost Imaging," Physical Review A, vol. 78, 061802, 4 pages (2008).

U.S. Kim, et al., "Multiaperture telecentric lens for 3D reconstruction," Optics Letters, vol. 36, No. 7, pp. 1050-1052 (2011).

P.S. Greenberg et al., "Quantitative rainbow schlieren deflectometry," Applied Optics, vol. 34, No. 19, pp. 3810-3825 (1995).

Ryan S. Bennink et al., "Two-Photon Coincidence Imaging with a Classical Source," Physical Review Letters, vol. 89, No. 11, pp. 113601-1 to 113601-4 (2002).

T.B. Pittman et al., "Optical imaging by means of two-photon quantum entanglement," Physical Review A vol. 52, No. 5, pp. R3429-R3432 (1995).

Walton L. Howes, "Rainbow schlieren and its applications," Appl. Optics, vol. 23, No. 14, pp. 2449-2460 (1984).

* cited by examiner

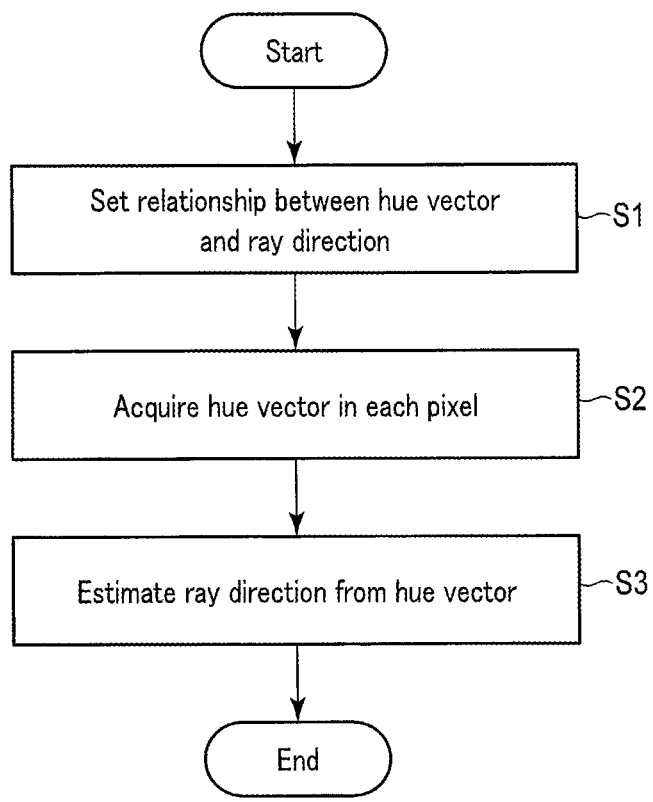
F I G. 4

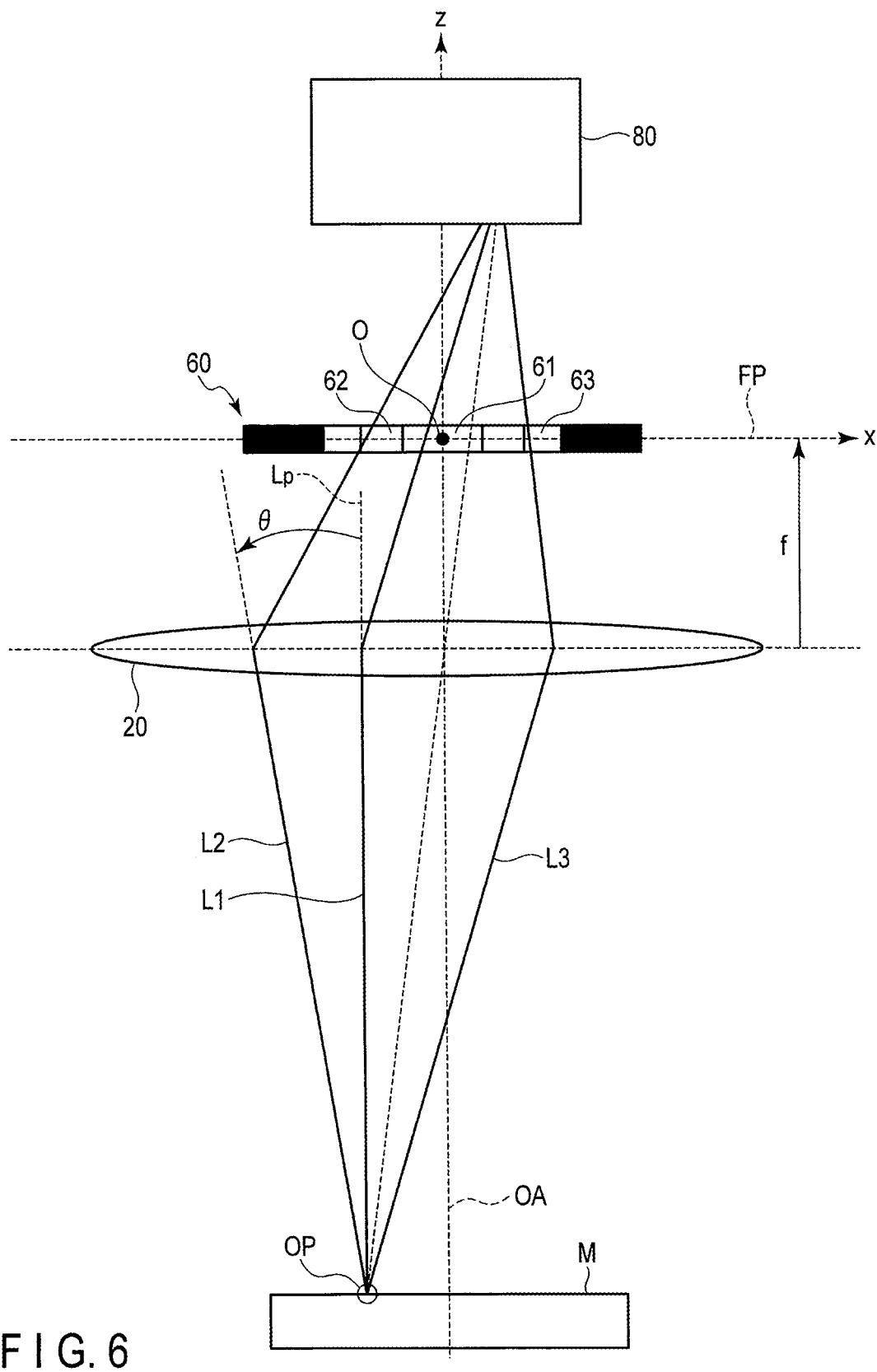
F I G. 6

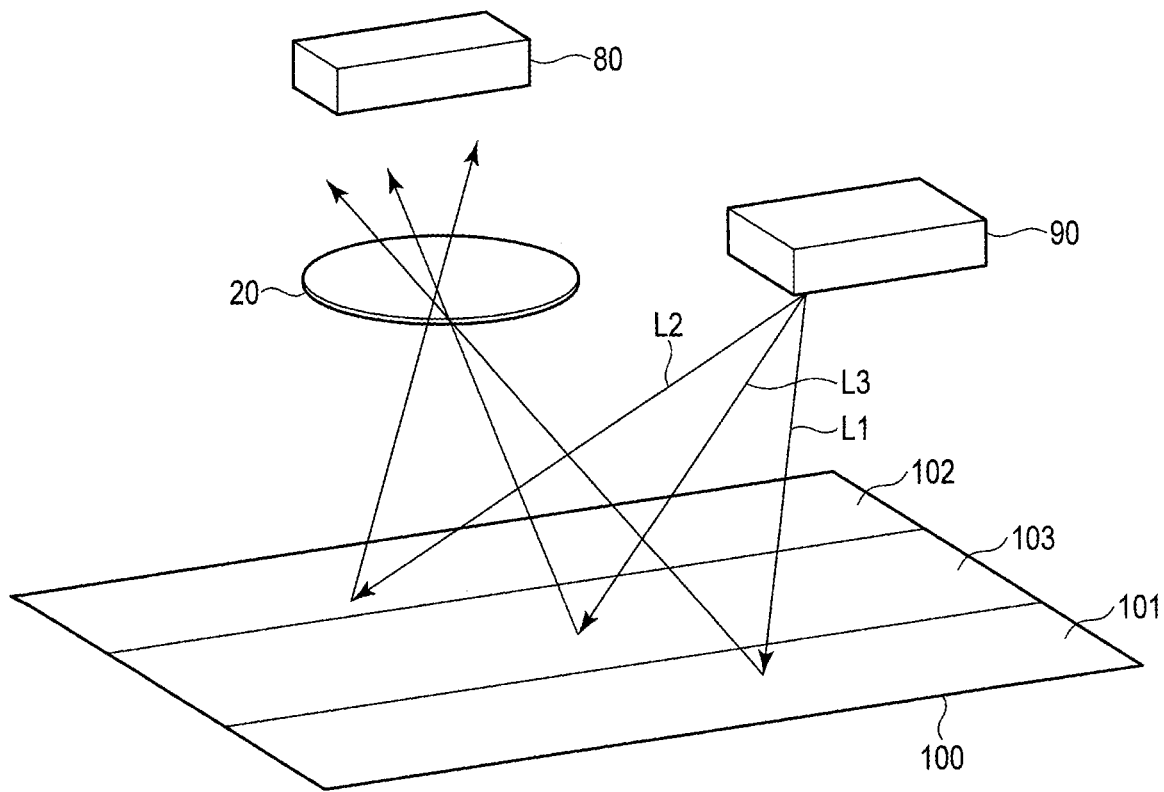
F I G. 9

OPTICAL INSPECTION METHOD, OPTICAL INSPECTION DEVICE, AND NON-TRANSITORY COMPUTER-READABLE STORAGE MEDIUM STORING OPTICAL INSPECTION PROGRAM

CROSS-REFERENCE TO RELATED APPLICATIONS

This application is based upon and claims the benefit of priority from Japanese Patent Application No. 2021-044567, filed Mar. 18, 2021; the entire contents of which are incorporated herein by reference.

FIELD

Embodiments described herein relate to an optical inspection method, an optical inspection device, and a non-transitory computer-readable storage medium storing an optical inspection program.

BACKGROUND

In a variety of industries, an optical inspection for an object in a non-contact manner is important. In the optical inspection, it is important to identify a ray direction in order to grasp object information. There is a conventional method of identifying the ray direction by using an amount called a hue. However, the conventionally used hue is a scalar quantity (that is, a quantity that only represents a magnitude unlike a multi-directional vector). The conventional hue is particularly called a hue scalar.

BRIEF DESCRIPTION OF THE DRAWINGS

FIG. 4 is a flowchart illustrating processing of a processing unit in an optical inspection method according to the first embodiment;

FIG. 6 is a side view illustrating a schematic configuration of an optical inspection device according to a third embodiment;

FIG. 9 is a perspective view illustrating a schematic configuration of an optical inspection device according to a fourth embodiment.

DETAILED DESCRIPTION

Figure 1:
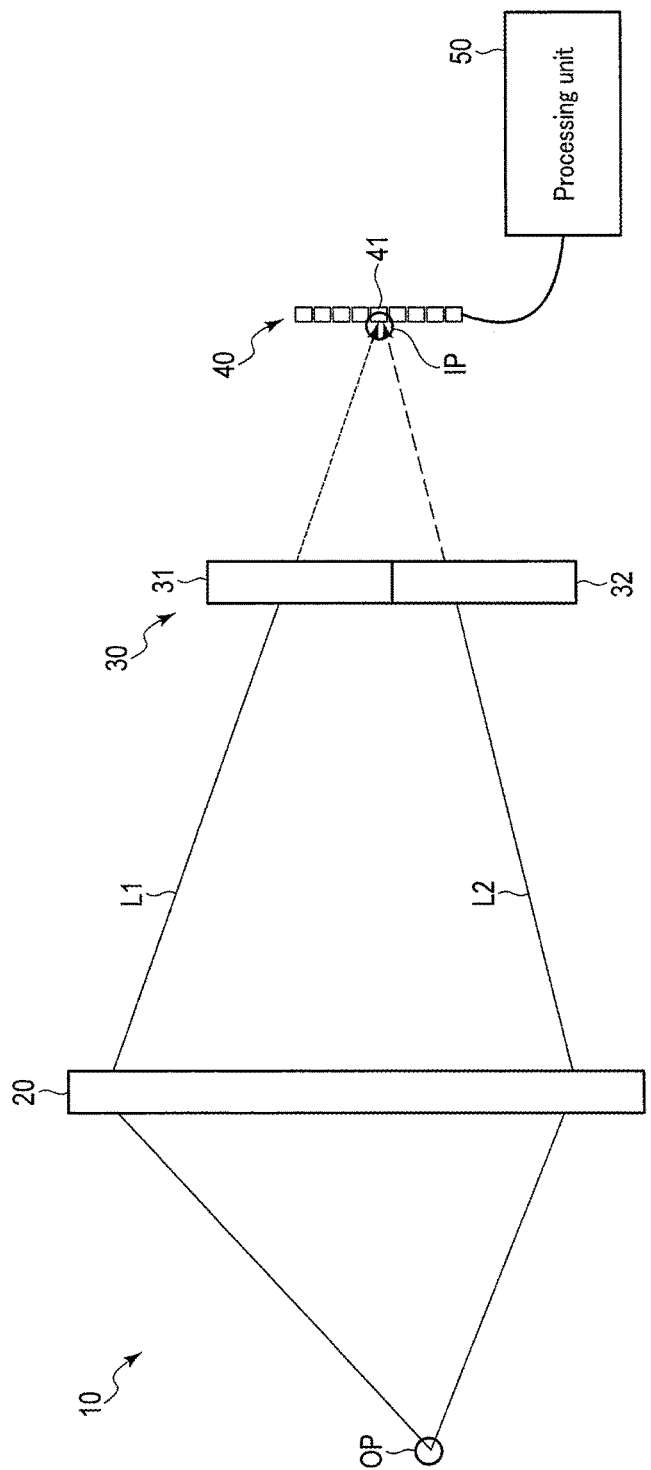
FIG. 1 is a side view illustrating a schematic configuration of an optical inspection device according to a first embodiment.

According to one embodiment, an optical inspection method acquires, for an image point imaged through separating light from an object point into beams of light in at least two different and independent wavelength ranges, a hue vector having, as independent axes, intensities of the beams of light in the at least two different and independent wavelength ranges. The method then acquires, from the hue vector, information regarding a ray direction of the light from the object point.

According to one embodiment, an optical inspection device includes an imaging unit, a hue vector generation unit, an image acquisition unit, and a processing unit. The imaging unit is configured to perform imaging of light from an object point. The hue vector generation unit is configured to separate the light from the object point into beams of light in at least two different and independent wavelength ranges and allow the separated beams of light to pass through. The image acquisition unit is configured to acquire an image point imaged by the beams of light in the at least two different and independent wavelength ranges, the beams of light having passed through the hue vector generation unit. The processing unit is configured to acquire, for the image point, a hue vector having, as independent axes, intensities of the beams of light in the at least two different and independent wavelength ranges, and then acquire, from the hue vector, information regarding a ray direction of the light from the object point.

According to one embodiment, a non-transitory computer-readable storage medium stores an optical inspection program. The program causes a computer to acquire, for an image point imaged through separating light from an object point into beams of light in at least two different and independent wavelength ranges, a hue vector having, as independent axes, intensities of the beams of light in the at least two different and independent wavelength ranges. The program then causes a computer to acquire, from the hue vector, information regarding a ray direction of the light from the object point.

Various embodiments will be described below with reference to the drawings. The drawings are schematic and conceptual, and a relationship between a thickness and width of each of portions, a ratio of sizes of the portions, and the like are not always the same as actual ones. Moreover, even when the same portion is illustrated, the dimension and ratio thereof may be illustrated differently between the drawings in some cases. In the specification of the present application and each of the drawings, the same reference numerals will be assigned to similar elements to those mentioned above referring to the previous drawings, and a detailed description thereof will be omitted.

First Embodiment

A first embodiment will be described below in detail with reference to the drawings. FIG. 1 illustrates a side view illustrating a schematic configuration of an optical inspection device 10 according to the present embodiment.

The optical inspection device 10 includes an imaging unit 20, a hue vector generation unit 30, an image acquisition unit 40, and a processing unit 50. In the present embodiment, two rays of light L1 and L2 in different directions are assumed for the sake of convenience. The two rays of light L1 and L2 in the different directions are defined as a first ray of light L1 and a second ray of light L2.

The rays of light L1 and L2 indicate propagation directions of light. For example, the light is an electromagnetic wave. That is, the light may be any of an X ray, an ultraviolet ray, visible light, an infrared ray, a millimeter wave, and a microwave, as long as being an electromagnetic wave. Herein, it is particularly assumed that the light is visible light with a wavelength from 400 nm to 800 nm.

The imaging unit 20 performs imaging of light from an object point OP. The imaging of light from the object point OP means transferring light emitted from the object point OP to an image point IP. In other words, the imaging means forming an image of the object point OP on the image point IP. In geometrical optics, the object point OP and the image point IP are conjugate with each other. Note that the object point OP and the image point IP are areas that can be regarded as points optically substantially. The image point IP is located on the image acquisition unit 40.

The image acquisition unit 40 acquires an image imaged (formed) by the imaging unit 20. The image acquisition unit 40 includes at least one pixel 41. For example, the image acquisition unit 40 includes a plurality of the pixels 41. Each pixel 41 simultaneously acquires light intensities for at least two different wavelength ranges. That is, each pixel 41 is capable of identifying beams of light in at least two different wavelength ranges. For example, each pixel 41 includes a plurality of light receiving elements capable of receiving beams of light in a plurality of wavelength ranges. For example, the image acquisition unit 40 includes a color filter and a CCD area sensor or a CMOS area sensor. Each pixel 41 includes a plurality of color areas of the color filter and a plurality of light receiving elements of the area sensor. In comparison with embodiments to be described later, this can also be said that imaging by a single-plate camera is performed.

The hue vector generation unit 30 can separate the reached light into beams of light in at least two different wavelength ranges, and can allow the separated beams of light to pass through. Herein, to allow the separated beams of light to pass through means either to transmit the separated beams of light or to reflect the separated beams of light.

In the present embodiment, the hue vector generation unit 30 includes two selection areas 31 and 32. The two selection areas 31 and 32 separate the light into beams of light in two different and independent wavelength ranges, and allow the separated beams of light to pass through. For example, the selection areas 31 and 32 of the hue vector generation unit 30 include optical filters configured to selectively allow beams of light in wavelength ranges independent of each other to pass through, respectively.

The two wavelength ranges of the beams of light that pass through the two selection areas 31 and 32 are defined as a first wavelength range and a second wavelength range. Moreover, the first wavelength range and the second wavelength range do not substantially overlap each other. The wavelength ranges that do not substantially overlap each other are called independent wavelength ranges.

Figure 2:
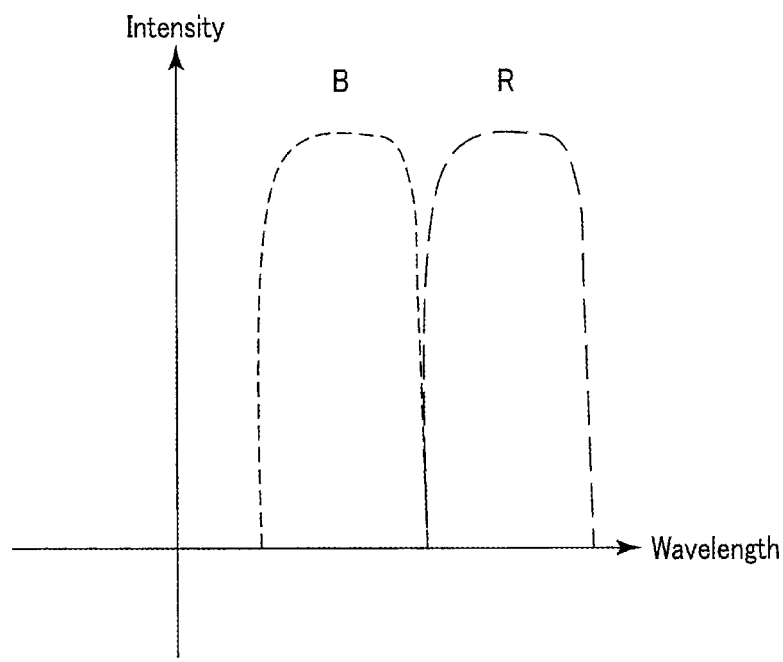
FIG. 2 is a graph illustrating an example of wavelength ranges of light separated by a hue vector generation unit.

FIG. 2 illustrates an example of a graph of the two wavelength ranges of the beams of light separated by the selection areas 31 and 32 of the hue vector generation unit 30. A horizontal axis indicates a wavelength, and a vertical axis indicates a light intensity. The two different and independent wavelength ranges are defined as B and R. For example, the two different and independent wavelength ranges B and R are defined as a first wavelength range B and a second wavelength range R. It is assumed that the first wavelength range B includes a wavelength of 450 nm, and that the second wavelength range R includes a wavelength of 650 nm That is, the first wavelength range B allows blue light to pass through, and the second wavelength range R allows red light to pass through. However, the first wavelength range B and the second wavelength range R are not limited to the above, and may be selected freely.

In the present embodiment, it is assumed that beams of light that travel through paths of the first ray of light L1 and the second ray of light L2 and have not reached the hue vector generation unit 30 yet are beams of visible light with wavelengths from 400 nm to 800 nm. After passing through the hue vector generation unit 30, the light that travels through a path of the first ray of light L1 has a wavelength of 450 nm, and the light that travels through a path of the second ray of light L2 has a wavelength of 650 nm. That is, after passing through the hue vector generation unit 30, the light that travels through the path of the first ray of light L1 includes blue light, and the light that travels through the path of the second ray of light L2 includes red light.

Figure 3:
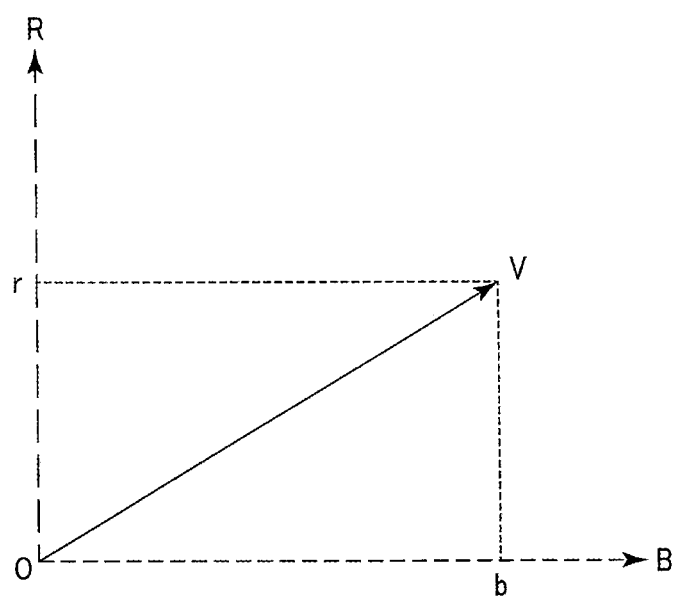
FIG. 3 is a graph illustrating a hue vector in a hue vector space.

FIG. 3 illustrates a graph of a hue vector in a hue vector space. A horizontal axis indicates the wavelength range B, and a vertical axis indicates the wavelength range R. Based on a signal strength in each pixel 41, the hue vector space can be created (set) for each pixel 41. Two signal strengths obtained in the pixel 41 for the two independent wavelength ranges B and R are defined as b and r, respectively. That is, the signal strength b indicates an intensity of the blue light obtained in the pixel 41, and the signal strength r indicates an intensity of the red light obtained in the pixel 41.

Moreover, the signal strengths b and r are assigned to individually independent coordinates. Herein, the signal strengths b and r are assigned to rectangular coordinates B and R that respectively correspond to the two independent wavelength ranges B and R, respectively. A coordinate position is expressed by a vector V, and V=(b, r) is established herein. That is, the hue vector space is set by the rectangular coordinates B and R, and the intensity of the light imaged on the pixel 41 is represented by the hue vector V=(b, r).

When a ray direction of the light imaged on the pixel 41 (for example, a unit direction of the light emitted from the object point OP in a three-dimensional space) changes, coordinates of the hue vector V=(b, r) change following this change. Hence, from the coordinates of the hue vector, it is possible to estimate the ray direction of the light imaged on the pixel 41.

An important feature of the hue vector is that the signal strength obtained by the light passing through one of the independent wavelength ranges does not affect the signal strength obtained by the light passing through the other independent wavelength range. Thus, the signal strengths can be assigned to coordinate axes independent of each other.

Meanwhile, the hue is conventionally treated as a scalar quantity. That is, a mixing ratio of the respective wavelength intensities is defined as a hue scalar. Since the hue scalar is a quantity that represents only a magnitude, the hue scalar cannot represent a two-dimensional hue vector having at least two or more constituent elements.

This represents that, for example, in overlapping of two light intensities, information on the two light intensities before the overlapping cannot be acquired from the light intensities after the overlapping. This represents that the overlapping of the light intensities is irreversible.

In contrast to this, in overlapping of beams of light having two wavelengths different from each other, information on the light intensities for the two wavelengths before the overlapping can be acquired in principle from the light strengths after the overlapping. This represents that the overlapping of the light wavelengths is reversible.

Accordingly, the hue vector, which is created based on the two different wavelengths of the beams of light that travel through paths of the rays of light L1 and L2 and then enter each pixel 41, has information on a direction and a magnitude in the hue vector space, and accordingly, is meant to have a larger amount of information than the conventional hue scalar.

From each pixel 41, the processing unit 50 receives the information on the light intensities for at least two different wavelengths. Moreover, the processing unit 50 acquires the hue vector from the information, and estimates the ray direction from the hue vector.

The processing unit 50 includes a computer. That is, the processing unit 50 includes a processor (CPU) and a storage (memory). For example, the storage includes a main storage and an auxiliary storage. The storage stores a program to be executed by the processor. The program is stored in a non-transitory computer-readable storage medium. That is, the storage includes the non-transitory computer-readable storage medium storing the program. The processor reads the program from the storage and executes the same, thereby performing a variety of processing. Moreover, the storage stores information required for the processing. For example, the processor reads an optical inspection program according to the present embodiment from such a storage and executes the same, thereby implementing processing in the processing unit 50 in an optical inspection method according to the present embodiment.

A description will be given below of an operating principle in the processing unit 50 according to the present embodiment.

For example, when the signal strength b in the pixel 41 is substantially larger than 0, and the signal strength r therein is substantially 0, the processing unit 50 determines that the light that has traveled through a path of the first ray of light L1 has reached the pixel 41. That is, the processing unit 50 determines that the light from the object point OP has traveled through the path of the first ray of light L1.

Moreover, when the signal strength b in the pixel 41 is substantially 0, and the signal strength r therein is substantially larger than 0, the processing unit 50 can determine that the light that has traveled through a path of the second ray of light L2 has reached the pixel 41. That is, the processing unit 50 determines that the light from the object point OP has traveled through the path of the second ray of light L2.

Alternatively, when both of the signal strengths b and r in the pixel 41 are substantially larger than 0, the processing unit 50 determines that the light from the object point OP has traveled through both of the path of the first ray of light L1 and the path of the second ray of light L2.

As described above, from the hue vector acquired in the pixel 41, the processing unit 50 can estimate the ray direction of the light from the object point OP imaged on the pixel 41, based on the signal strengths b and r in the pixel 41.

Herein, assumed is a case where the light intensities cannot be distributed to the independent wavelength ranges as in the hue vector generation unit 30 according to the present embodiment. That is, assumed is a case where the wavelength ranges to be separated by the hue vector generation unit 30 overlap each other and the wavelength ranges are not independent of each other. In such a case, the hue vector space cannot be set. That is, the hue vector cannot be composed for the pixel 41.

Then, the signal strength for the wavelength range when the light that has traveled through the path of the first ray of light L1 has reached the pixel 41 increases together with the signal strength for the wavelength range when the light that has traveled through the path of the second ray of light L2 has reached the pixel 41. On the contrary, the signal strength for the wavelength range when the light that has traveled through the path of the second ray of light L2 has reached the pixel 41 increases together with the signal strength for the wavelength range when the light that has traveled through the path of the first ray of light L1 has reached the pixel 41. Therefore, it is difficult for the processing unit 50 to estimate, from the signal strengths of the pixel 41, to which of the first ray of light L1 and the second ray of light L2 the ray direction belongs.

The hue scalar can be composed even when the hue vector cannot be composed. The ray direction has heretofore been estimated by using the hue scalar; however, since the scalar quantity is a quantity that represents only the magnitude, the scalar quantity has a less amount of held information than the two-dimensional vector.

Therefore, by using the hue vector, it is possible to increase the information on the ray direction that can be associated with the hue vector more greatly than the information on the ray direction that can be associated with the conventional hue scalar. Thus, it is possible for the processing unit 50 to estimate the ray direction of the light from the object point OP imaged on the pixel 41.

The optical inspection method according to the present embodiment separates the light from the object point OP, the light being to be imaged by the imaging unit 20, into beams of light in at least two different and independent wavelength ranges by the hue vector generation unit 30. As a result, the image point IP imaged by the beams of light in the at least two independent wavelength ranges is formed on the image acquisition unit 40. Moreover, in each pixel 41 of the image acquisition unit 40, the optical inspection method acquires light intensities in at least two independent wavelength ranges. Further, in the processing unit 50, the optical inspection method estimates a ray direction of light from the object point OP based on the light intensity of each pixel 41.

FIG. 4 illustrates a flowchart of processing to be implemented in the processing unit 50.

First, for the processing unit 50, a relationship between the hue vector and the ray direction is set in advance (S1). For example, the relationship between the hue vector and the ray direction may be a lookup table that records information on a ray direction for a variety of coordinates of the hue vector. Herein, for example, the ray direction is a unit direction of the light emitted from the object point OP in a three-dimensional space. For example, the relationship between the hue vector and the ray direction is stored in the storage in the processing unit 50.

For example, in the hue vector space, when the hue vector is parallel to a B-axis, this means that the imaged light has traveled through the path of the first ray of light L1, and when the hue vector is parallel to an R-axis therein, this means that the imaged light has traveled through the path of the second ray of light L2.

However, in some cases, a result of estimating the ray direction may be affected by a wavelength spectrum of the light immediately before entering the hue vector generation unit 30, ambient light from the outside, and the like. In such a case, calibration is preferably performed for the hue vector and the ray direction. Alternatively, such an influence from the external ambient light is preferably offset.

Next, the processing unit 50 acquires the hue vector in each pixel 41 of the image acquisition unit 40 based on the signal strength in each pixel 41 for the image thus imaged (S2). That is, the processing unit 50 acquires the hue vector $V=(b, r)$ in each pixel 41 based on the signal strength b of the blue light in each pixel 41 and the signal strength r of the red light therein.

Moreover, by using the obtained hue vector, the processing unit 50 refers to the relationship between the hue vector and the ray direction, which is set in advance, to estimate the ray direction of the light from the object point OP imaged on each pixel 41 (S3). For example, as mentioned above, the ray direction is the unit direction of the light in the three-dimensional space, the light being to be emitted from the object point OP. From the above, such ray directions can be estimated across the entire pixels 41.

As above, in accordance with the optical inspection method and the optical inspection device according to the present embodiment, the ray direction is estimated based on the hue vector, and accordingly, the ray direction can be identified.

Second Embodiment

Figure 5:
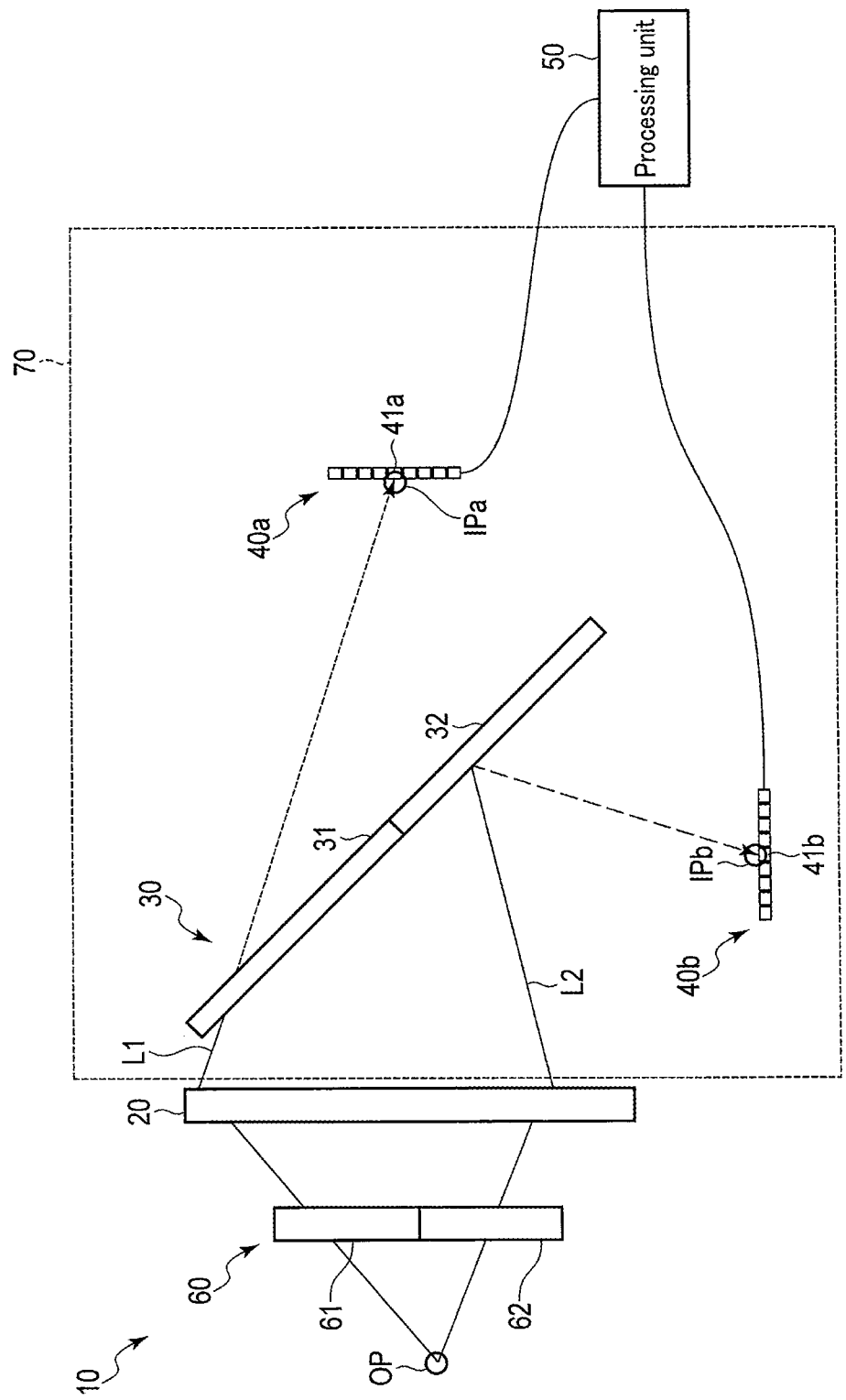
FIG. 5 is a side view illustrating a schematic configuration of an optical inspection device according to a second embodiment.

A second embodiment will be described below in detail with reference to the drawings. FIG. 5 illustrates a side view illustrating a schematic configuration of an optical inspection device 10 according to the present embodiment.

The optical inspection device 10 according to the present embodiment is basically the same as that of the first embodiment, but further includes a ray direction selection unit 60. Moreover, the present embodiment performs imaging by a two-plate camera 70. Different points from the first embodiment will be described below.

The two-plate camera 70 includes a hue vector generation unit 30, and two image acquisition units 40a and 40b (a first image acquisition unit 40a and a second image acquisition unit 40b). For example, the image acquisition units 40a and 40b may be CCD area sensors or CMOS area sensors. However, the image acquisition units 40a and 40b are not limited to these.

The first image acquisition unit 40a includes at least one first pixel 41a, and the second image acquisition unit 40b includes at least one second pixel 41b. For example, the first image acquisition unit 40a includes a plurality of the first pixels 41a, and the second image acquisition unit 40b includes a plurality of the second pixels 41b. Each first pixel 41a includes one first light receiving element, and each second pixel 41b includes one second light receiving element. For example, each of the first light receiving element of each first pixel 41a and the second light receiving element of each second pixel 41b is one light receiving element of an area sensor.

A signal obtained from the first light receiving element of each first pixel 41a in the first image acquisition unit 40a and a signal obtained from the second light receiving element of each second pixel 41b in the second image acquisition unit 40b are signals independent of each other, and are assigned as signals for the respective same pixels 41a and 41b in the respective image acquisition units 40a and 40b. That is, the respective pixels 41a and 41b in the two image acquisition units 40a and 40b correspond to each other in a one-to-one relationship in accordance with position coordinates of the pixels.

In the hue vector generation unit 30 according to the present embodiment, a selection area 31 transmits light in a first wavelength range, and a selection area 32 reflects light in a second wavelength range. The first wavelength range and the second wavelength range are independent of each other. For example, the first wavelength range includes a wavelength of 450 nm in blue light, and the second wavelength range includes a wavelength of 650 nm in red light.

The imaging unit 20 images (forms an image of) light emitted from the object point OP on a first image point IPa and a second image point IPb. The first image point IPa and the second image point IPb are located at the first image acquisition unit 40a and the second image acquisition unit 40b, respectively.

The ray direction selection unit 60 includes at least two different selection areas. Each selection area separates the reached light into a beam of light in a specific wavelength range and allows the separated beam of light to pass through. Herein, to allow the beam of light to pass through means either to transmit the beam of light or to reflect the beam of light. Herein, the wavelength ranges in the two different selection areas do not have to be independent of each other. That is, the two wavelength ranges may overlap each other. However, the two wavelength ranges may be independent of each other.

In the present embodiment, for example, the ray direction selection unit 60 includes a first selection area 61 and a second selection area 62. The first selection area 61 allows the light with a wavelength of 450 nm to pass through, and the second selection area 62 allows the light with a wavelength of 650 nm to pass through. That is, the first selection area 61 allows blue light to pass through, and the second selection area 62 allows red light to pass through. For example, the first selection area 61 and second selection area 62 of the ray direction selection unit 60 are optical filters configured to allow beams of light in wavelength ranges different from each other to pass through.

The processing unit 50 receives image data from the first image acquisition unit 40a and the second image acquisition unit 40b, and acquires a hue vector based on the image data. That is, the processing unit 50 acquires the hue vector from information on light intensities of the respective pixels 41a and 41b at the same position coordinates in the two image acquisition units 40a and 40b. Moreover, the processing unit 50 estimates a ray direction from the hue vector. Processing in the processing unit 50 is as described in the first embodiment.

An operation in the optical inspection device 10 according to the present embodiment will be described.

Light that is emitted from the object point OP and travels through a path of the first ray of light L1 passes through the first selection area 61 of the ray direction selection unit 60, and becomes light including blue light with a wavelength of 450 nm. Moreover, light that is emitted from the object point OP and travels through a path of the second ray of light L2 passes through the second selection area 62 of the ray direction selection unit 60, and becomes light including red light with a wavelength of 650 nm.

The light that has traveled through the path of the first ray of light L1 is received by the first light receiving element of each first pixel 41a in the first image acquisition unit 40a. Moreover, the light that has traveled through the path of the second ray of light L2 is received by the second light receiving element of each second pixel 41b in the second image acquisition unit 40b. The first light receiving element and the second light receiving element are assigned as constituent elements of the same pixels 41a and 41b. That is, a hue vector to be created by independent two axes can be composed for the respective pixels 41a and 41b.

An optical inspection method according to the present embodiment first separates the light from the object point OP, the light being to be imaged by the imaging unit 20, into beams of light in at least two different wavelength ranges by the ray direction selection unit 60, and then separates the separated beams of light into beams of light in at least two different and independent wavelength ranges by the hue vector generation unit 30. As a result, the image points IPa and IPb imaged by the beams of light in the at least two independent wavelength ranges are formed on the image acquisition units 40*a* and 40*b*. Moreover, in the respective pixels 41*a* and 41*b* of the image acquisition units 40*a* and 40*b*, the optical inspection method acquires light intensities in at least two independent wavelength ranges. Further, in the processing unit 50, the optical inspection method estimates a ray direction of light from the object point OP based on the light intensities of the respective pixels 41*a* and 41*b*.

The processing unit 50 acquires the hue vector in the respective pixels 41*a* and 41*b* at the same position coordinates, and estimates the ray direction from the hue vector. Processing to be implemented by the processing unit 50 in order to estimate the ray direction is similar to that in the first embodiment.

Also in the present embodiment, the ray direction is estimated based on the hue vector, and accordingly, the ray direction can be identified.

In the optical inspection method and the optical inspection device according to the present embodiment, both of the light that travels through the path of the first ray of light L1, which is transmitted through the hue vector generation unit 30, and the light that travels through the path of the second ray of light L2, which is reflected by the hue vector generation unit 30, are used. It is easy for the hue vector generation unit 30 to independently define the wavelength range of the transmitted light and the wavelength range of the reflected light. Therefore, independent wavelength ranges can be achieved with ease.

Third Embodiment

Figure 7:
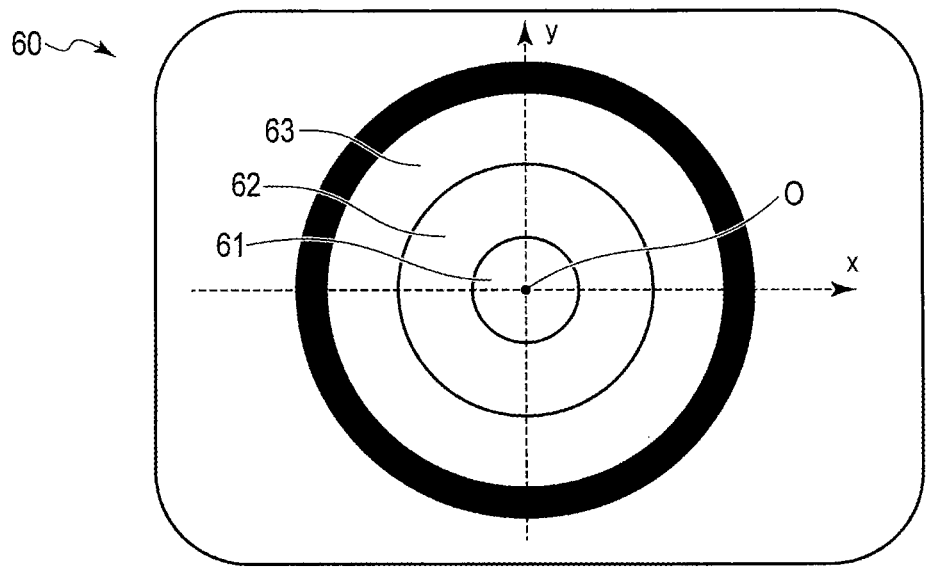
FIG. 7 is a plan view illustrating a schematic configuration of a ray direction selection unit according to the third embodiment.

A third embodiment will be described below in detail with reference to the drawings. FIG. 6 illustrates a side view illustrating a schematic configuration of an optical inspection device 10 according to the present embodiment. In FIG. 6, illustration of the processing unit 50 is omitted. Moreover, FIG. 7 illustrates a plan view illustrating a schematic configuration of a ray direction selection unit 60 according to the present embodiment.

The optical inspection device 10 according to the present embodiment is basically the same as that of the second embodiment, but includes a ray direction selection unit 60 on a focal plane FP of the imaging unit 20. On the focal plane FP of the imaging unit 20, light that enters the imaging unit 20 passes through a position corresponding to a ray direction thereof. That is, light in the same ray direction passes through the same position. In FIG. 6, beams of light that have ray directions at the same θ with respect to a straight line Lp parallel to an optical axis OA reach positions on the same circumference on the focal plane FP. The present embodiment performs imaging by a three-plate camera 80. Different points from the second embodiment will be described below.

In the present embodiment, three rays of light L1, L2, and L3 in different directions are assumed for the sake of convenience. The three rays of light L1, L2, and L3 in the different directions are defined as a first ray of light L1, a second ray of light L2, and a third ray of light L3. For example, it is assumed that light that travels through a path of the first ray of light L1 has a wavelength of 650 nm, that light that travels through a path of the second ray of light L2 has a wavelength of 450 nm, and that light that travels through a path of the third ray of light L3 has a wavelength of 550 nm. That is, it is assumed that the light that travels through the path of the first ray of light L1 includes red light, that the light that travels through the path of the second ray of light L2 includes blue light, and that the light that travels through the path of the third ray of light L3 includes green light. However, the wavelengths can be freely selected without being limited to the above.

The ray direction selection unit 60 includes, for example, a plurality of different and concentric selection areas. For example, as illustrated in FIG. 7, the ray direction selection unit 60 includes a first selection area 61, a second selection area 62, and a third selection area 63, which define a point through which the optical axis OA passes as an origin O of coordinates, and are concentric with the origin O taken as a center. The first selection area 61 allows the light with a wavelength of 650 nm to pass through, the second selection area 62 allows the light with a wavelength of 450 nm to pass through, and the third selection area 63 allows the light with a wavelength of 550 nm to pass through. That is, the first selection area 61 allows red light to pass through, the second selection area 62 allows blue light to pass through, and the third selection area 63 allows green light to pass through.

For example, the first selection area 61, the second selection area 62, and the third selection area 63 of the ray direction selection unit 60 are optical filters configured to allow beams of the light in wavelength ranges different from one another to pass through as in the second embodiment.

Light that travels through a path of the first ray of light L1 passes through the innermost first selection area 61, light that travels through a path of the second ray of light L2 passes through the intermediate second selection area 62, and light that travels through a path of the third ray of light L3 passes through the outermost third selection area 63.

Figure 8:
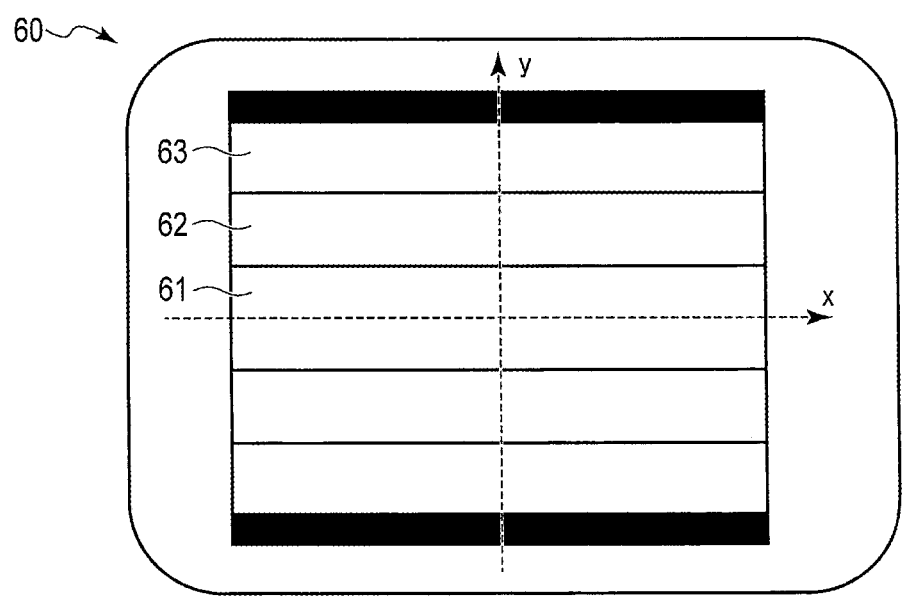
FIG. 8 is a plan view illustrating a schematic configuration of a modification example of the ray direction selection unit according to the third embodiment.

Herein, illustrated is an example where the ray direction selection unit 60 includes such concentric selection areas 61, 62, and 63; however, the selection areas 61, 62, and 63 do not always have to be arranged concentrically, and may be arranged in other forms. FIG. 8 illustrates a plan view illustrating a schematic configuration of a modification example of the ray direction selection unit 60. The ray direction selection unit 60 of the modification example includes a plurality of different and striped selection areas 61, 62, and 63. The first selection area 61 is located at a center including an origin O of coordinates, the second selection area 62 is located on and under the first selection area 61 along a y-axis, and the third selection area 63 is located on and under the second selection area 62 along the y-axis. Optical characteristics of the respective selection areas 61, 62, and 63 of the ray direction selection unit 60 in FIG. 8 are similar to optical characteristics of the respective selection areas 61, 62, and 63 of the ray direction selection unit 60 in FIG. 7.

In FIG. 6, the three-plate camera 80 is one formed by extending the two-plate camera 70 of the second embodiment to a three-plate one. Although not illustrated, as can be easily imagined, the three-plate camera 80 includes a hue vector generation unit and three image acquisition units. The hue vector generation unit separates reached light into beams of light in three different and independent wavelength ranges, and allows the separated beams of light to pass through. The three image acquisition units receive the beams of light in three different wavelength ranges, the beams of light being separated by the hue vector generation unit. The imaging unit 20 forms images of an object point OP, which is located on a surface of an object M, on three image points located on the three image acquisition units in the three-plate camera 80.

The optical inspection device 10 according to the present embodiment uses the three-plate camera 80, and accordingly, can acquire a three-dimensional hue vector to be created by three axes independent of one another. That is, this means that, when an intensity gradation of each axis is M for example, M×M×M=$M^3$ ways of ray directions can be assigned to the hue vector.

The optical inspection device 10 according to the present embodiment is an example of using the three-plate camera 80; however, in place of this, an N-plate camera may be used. In general, an N-dimensional hue vector can be acquired by the N-plate camera. At that time, MN ways of ray directions can be assigned to the hue vector.

Moreover, by the ray direction selection unit 60 disposed on the focal plane FP of the imaging unit 20, light that enters the imaging unit 20 passes through a position corresponding to a ray direction thereof. That is, light in the same ray direction passes through the same position. Thus, through the ray direction selection unit 60, beams of light having different wavelength ranges pass in accordance with such ray directions. Herein, the respective wavelength ranges may be independent or not. However, it is assumed that the respective wavelength ranges are different.

In the optical inspection method and the optical inspection device according to the present embodiment, it is possible to assign the $M^3$ ways of gradations to the hue vector. Thus, if $M^3$ ways of different selection areas are created in advance in the ray direction selection unit 60, $M^3$ ways of different ray directions can be identified by the processing unit 50. Processing for identifying the ray direction in the processing unit 50 is similar to that in the first embodiment.

Also in the optical inspection method and the optical inspection device according to the present embodiment, the ray direction is estimated based on the hue vector, and accordingly, the ray direction can be identified. Even when the respective wavelength ranges in the ray direction selection unit 60 are not independent, the respective wavelength ranges are different, and accordingly, differences therebetween can be identified by the hue vector.

Fourth Embodiment

A fourth embodiment will be described below in detail with reference to the drawings. FIG. 9 illustrates a perspective view illustrating a schematic configuration of an optical inspection device 10 according to the present embodiment. In FIG. 9, illustration of the processing unit 50 is omitted.

The optical inspection device 10 according to the present embodiment is basically the same as that of the second embodiment, but further includes a projector illumination unit 90. The projector illumination unit 90 can project, onto an object, beams of light in at least two different and independent wavelength ranges. By the light projection, an irradiation field 100 (area brightened by irradiation by the projector illumination unit 90) is formed on a surface of the object. On the irradiation field 100, the beams of light in at least two different and independent wavelength ranges are projected onto different positions. The beams of light that pass through (that is, are reflected by or transmitted through) those different positions are imaged by the three-plate camera 80.

In the present embodiment, the projector illumination unit 90 projects beams of light that travel through paths of three rays of light L1, L2, and L3 in different directions. The three rays of light L1, L2, and L3 in the different directions are defined as a first ray of light L1, a second ray of light L2, and a third ray of light L3. For example, it is assumed that light that travels through a path of the first ray of light L1 has a wavelength of 450 nm, that light that travels through a path of the second ray of light L2 has a wavelength of 650 nm, and that light that travels through a path of the third ray of light L3 has a wavelength of 550 nm. That is, it is assumed that the light that travels through the path of the first ray of light L1 is blue light, that the light that travels through the path of the second ray of light L2 is red light, and that the light that travels through the path of the third ray of light L3 is green light. However, the wavelengths can be freely selected without being limited to the above.

The irradiation field 100 is formed by the projector illumination unit 90. The irradiation field 100 has three areas (first area 101, second area 102, and third area 103). The first area 101 is a blue area irradiated with blue light that travels through the path of the first ray of light L1, the second area 102 is a red area irradiated with red light that travels through the path of the second ray of light L2, and the third area 103 is a green area irradiated with green light that travels through the path of the third ray of light L3.

In terms of optical action, the irradiation field 100 can be regarded to be equivalent to the ray direction selection units 60 in the second embodiment and the third embodiment. Light from the irradiation field 100 is imaged by an imaging unit 20 and the three-plate camera 80. A configuration of the three-plate camera 80 is as described in the third embodiment. That is, the three-plate camera 80 includes three image acquisition units. The image acquisition units of the three-plate camera 80 acquire images in which the irradiation field 100 is imaged, signal strengths of the respective pixels of the image acquisition units are processed in the processing unit 50 in a similar way to the first embodiment, and the ray directions is estimated.

From the above, in the processing unit 50, through which position of the irradiation field 100 the beam of light has passed, that is, the ray direction can be acquired, based on the hue vector.

Also in the optical inspection method and the optical inspection device according to the present embodiment, the ray directions is estimated based on the hue vector, and accordingly, the ray direction can be identified.

The projector illumination unit 90 may be one that can project an image formed on the irradiation field. In that case, accuracy improvement of determining the ray direction can be achieved.

In accordance with the optical inspection method and the optical inspection device according to at least one of the embodiments mentioned above, the ray direction is acquired from the hue vector, which allows identifying the ray directions.

In the embodiments, the description has been given of the example where the hue vector generation unit 30 includes two selection areas 31 and 32 or three selection areas 31, 32, and 33; however, the number of selection areas provided in the hue vector generation unit 30 is not limited to these. The hue vector generation unit 30 may include four or more selection areas. For example, as long as the separated beams of light that have passed through the respective selection areas can be detected, the hue vector generation unit 30 may include many selection areas.

When the hue vector generation unit 30 includes four or more selection areas, it is possible to set a multi-dimensional hue vector space having four or more independent coordinate axes and a multi-dimensional hue vector. It is also possible to identify the ray direction more in detail than in the embodiments by acquiring the ray direction by using such a multi-dimensional hue vector as described above.

According to the optical inspection method, optical inspection device, and non-transitory computer-readable storage medium storing an optical inspection program of at least one embodiment described above, it is possible to identify a ray direction of light from an object point based on a hue vector in a hue vector space set for an image point conjugate with the object point.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical inspection method comprising:
    separating, by an optical filter, light from an object point into beams of light in at least two different and independent wavelength ranges;
    imaging, by an imaging element, the beams of light in at least two different and independent wavelength ranges;
    acquiring, by an imager, an image point imaged with the beams of light in at least two different and independent wavelength ranges;
    acquiring, by a processor, a hue vector having, as independent axes, intensities of the beams of light in the at least two different and independent wavelength ranges for the image point; and
    acquiring, by the processor from the hue vector, information regarding a ray direction of the light from the object point.

2. The optical inspection method according to claim 1, further comprising
    separating, by an additional optical filter, the light from the object point into beams of light in at least two different wavelength ranges before separating into the beams of light in the at least two different and independent wavelength ranges.

3. The optical inspection method according to claim 2, wherein,
    the additional optical filter includes a plurality of different and concentric selection areas separating the light from the object point into beams of light in mutually different wavelength ranges and allowing the separated beams of light to pass through.

4. The optical inspection method according to claim 2, wherein,
    the additional optical filter includes a plurality of different and striped selection areas separating the light from the object point into beams of light in mutually different wavelength ranges and allowing the separated beams of light to pass through.

5. The optical inspection method according to claim 1, wherein
    the imaging of the image point is performed by an N-plate camera (N is an integer of two or more).

6. The optical inspection method according to claim 1, comprising:
    forming, by a projector illuminator, an irradiation field by irradiating an object with beams of light in at least two different wavelength ranges;
    acquiring, by the imager, an image by imaging the irradiation field; and
    acquiring, by the processor, the hue vector and the information for each pixel of the image.

7. An optical inspection device comprising:
    an imaging element configured to perform imaging of light from an object point;
    a optical filter configured to separate the light from the object point into beams of light in at least two different and independent wavelength ranges and allow the separated beams of light to pass through;
    an imager configured to acquire an image point imaged by the beams of light in the at least two different and independent wavelength ranges, the beams of light having passed through the optical filter; and
    a processor configured to acquire, for the image point, a hue vector having, as independent axes, intensities of the beams of light in the at least two different and independent wavelength ranges, and then acquire, from the hue vector, information regarding a ray direction of the light from the object point.

8. The optical inspection device according to claim 7, further comprising
    an additional optical filter configured to separate the light from the object point into beams of light in at least two different wavelength ranges and allow the separated beams of light to pass through before the light reaches the optical filter.

9. The optical inspection device according to claim 8, wherein
    the additional optical filter includes a plurality of different and concentric selection areas configured to separate the light from the object point into beams of light in mutually different wavelength ranges and allow the separated beams of light to pass through.

10. The optical inspection device according to claim 8, wherein
    the additional optical filter includes a plurality of different and striped selection areas configured to separate the light from the object point into beams of light in mutually different wavelength ranges and allow the separated beams of light to pass through.

11. The optical inspection device according to claim 7, comprising
    an N-plate camera (N is an integer of two or more) configured to image the image point, the N-plate camera including the optical filter and the imager.

12. The optical inspection device according to claim 7, further comprising
    a projector illuminator configured to irradiate an object with beams of light in at least two different wavelength ranges and then form an irradiation field, wherein
    the imager acquires an image imaged by the irradiation field through the imaging element and the optical filter, and
    for each pixel of the image, the processor acquires the hue vector and acquires the information.

13. A non-transitory computer-readable storage medium storing an optical inspection program that causes a computer to:

separate, by an optical filter, light from an object point into beams of light in at least two different and independent wavelength ranges, image, by an imaging element, the beams of light in at least two different and independent wavelength ranges and acquire a hue vector having, as independent axes, intensities of the beams of light in the at least two different and independent wavelength ranges, for an image point imaged with the beams of light in at least two different and independent wavelength ranges; and acquire, from the hue vector, information regarding a ray direction of the light from the object point.

\* \* \* \* \*